United States Patent
Schneider et al.

(10) Patent No.: US 9,589,622 B2
(45) Date of Patent: *Mar. 7, 2017

(54) METHOD OF WRITING TO A SPIN TORQUE MAGNETIC RANDOM ACCESS MEMORY

(71) Applicant: Everspin Technologies, Inc., Chandler, AZ (US)

(72) Inventors: Michael Schneider, Chandler, AZ (US); Dimitri Houssameddine, Gilbert, AZ (US); Jon Slaughter, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/057,761

(22) Filed: Mar. 1, 2016

(65) Prior Publication Data

US 2016/0180911 A1 Jun. 23, 2016

Related U.S. Application Data

(62) Division of application No. 14/313,824, filed on Jun. 24, 2014, now Pat. No. 9,286,963.

(60) Provisional application No. 61/846,970, filed on Jul. 16, 2013.

(51) Int. Cl.
*G11C 11/00* (2006.01)
*G11C 11/16* (2006.01)

(52) U.S. Cl.
CPC ...... *G11C 11/1675* (2013.01); *G11C 11/1673* (2013.01)

(58) Field of Classification Search
CPC .......... G11C 11/16; G11C 11/15; G11C 11/14
USPC ........................................ 365/158, 171, 173
See application file for complete search history.

(56) References Cited

U.S. PATENT DOCUMENTS

| | | | |
|---|---|---|---|
| 8,331,128 B1 * | 12/2012 | Derhacobian | G11C 29/816 365/100 |
| 9,286,963 B2 * | 3/2016 | Schneider | G11C 11/1673 |
| 2011/0032744 A1 | 2/2011 | Ohmori et al. | |
| 2013/0155760 A1 | 6/2013 | Houssameddine | |
| 2014/0247653 A1 | 9/2014 | Wang et al. | |

* cited by examiner

*Primary Examiner* — Huan Hoang

(57) ABSTRACT

Circuitry and methods provide an increased tunnel barrier endurance (lifetime) previously shortened by dielectric breakdown by providing a charging pulses of opposite polarity in comparison with write pulses. The charging pulse of opposite polarity may comprise equal or different width and amplitude than that of the write pulse, may be applied with each write pulse or a series of write pulses, and may be applied prior to or subsequent to the write pulse. A register is also used to keep track of the read pulse polarity such that read pulses of alternating polarity can be used in reading operations.

20 Claims, 5 Drawing Sheets

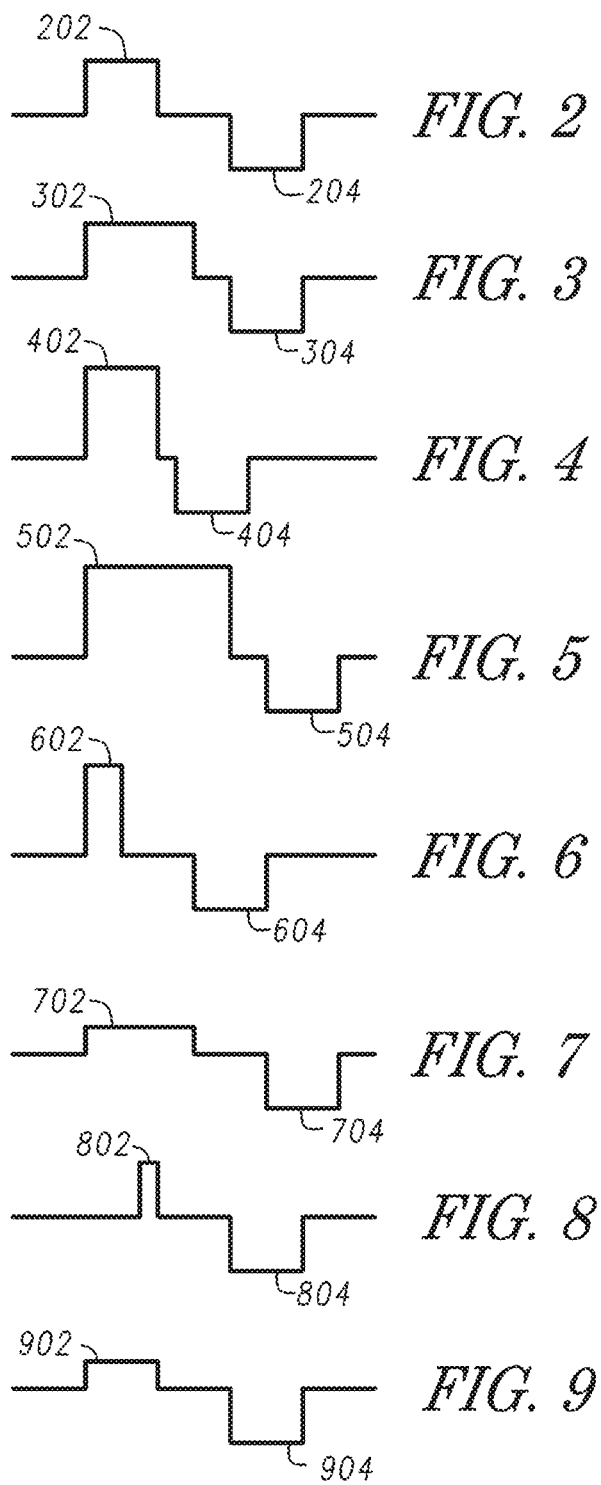

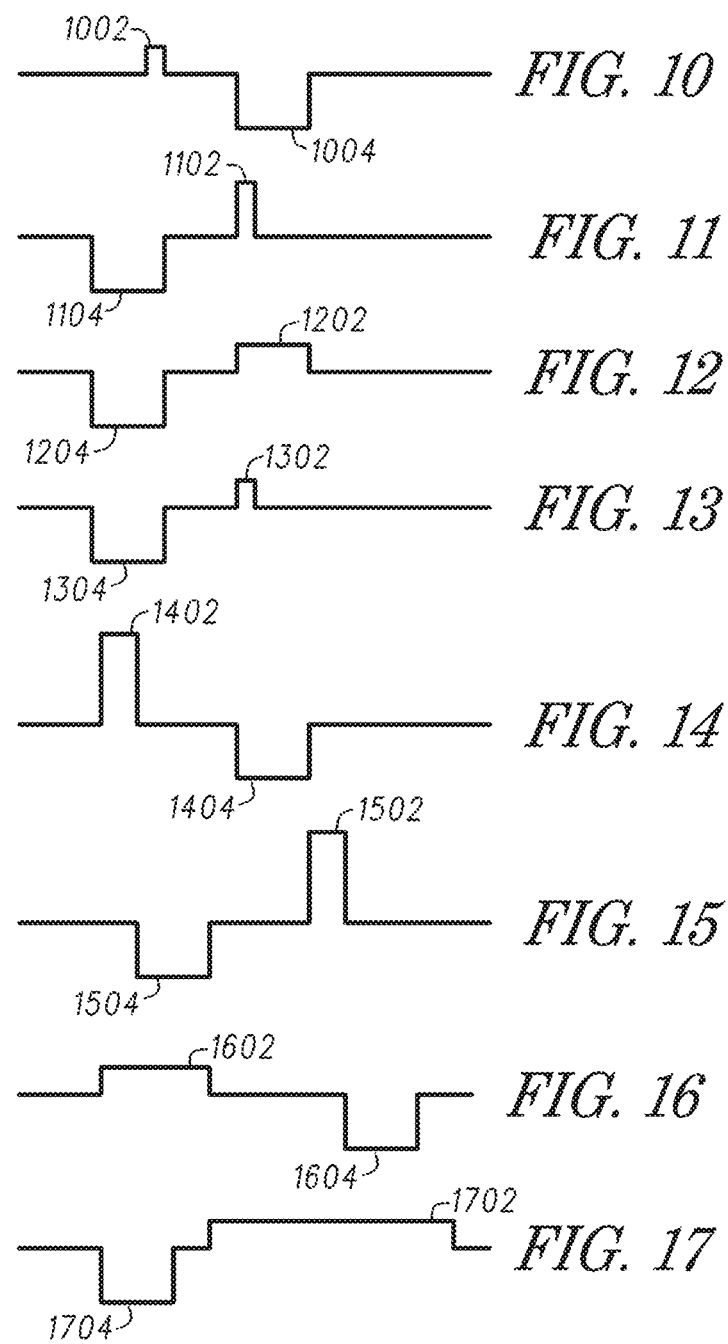

```
┌─────────────────────────────────────────────────────┐
│ PROVIDING A CHARGING PULSE TO THE BITS, THE CHARGING PULSE │—1802
│ HAVING AN OPPOSITE POLARITY FROM THE WRITE PULSE    │
└─────────────────────────────────────────────────────┘

┌─────────────────────────────────────────────────────┐
│ PROVIDING A WRITE PULSE SEQUENCE TO THE BITS, THE WRITE │—1902
│ PULSE SEQUENCE COMPRISING ONE OR MORE WRITE PULSES  │
└─────────────────────────────────────────────────────┘
                         ↓
┌─────────────────────────────────────────────────────┐
│ PROVIDING A CHARGING PULSE TO THE BITS, THE CHARGING PULSE │
│ HAVING AN OPPOSITE POLARITY FROM THE ONE OR MORE WRITE │—1904
│ PULSES, THE CHARGING PULSE OCCURING ONE OF BEFORE   │
│ OR AFTER THE WRITE PULSE SEQUENCE                   │
└─────────────────────────────────────────────────────┘

┌──────────────────────┐
│   SAMPLE THE BIT     │—2002
└──────────────────────┘
            ↓
┌──────────────────────┐
│ APPLY RESET (0) WRITE PULSE │—2004
└──────────────────────┘
            ↓
┌──────────────────────┐
│ EVALUATE THE BIT THROUGH │—2006
│ RESAMPLE AND COMPARE │
└──────────────────────┘
            ↓
         ╱2008╲              FIG. 20
        ╱ BIT=1? ╲——YES——→ ┌──────────────────────┐
        ╲        ╱          │ APPLY SET(1) WRITE PULSE │—2010
         ╲_____╱           └──────────────────────┘
            │
           NO
            ↓
    2012—┌──────────────────────┐
         │ NO WRITE PULSE NEEDED │
         └──────────────────────┘

2000
```

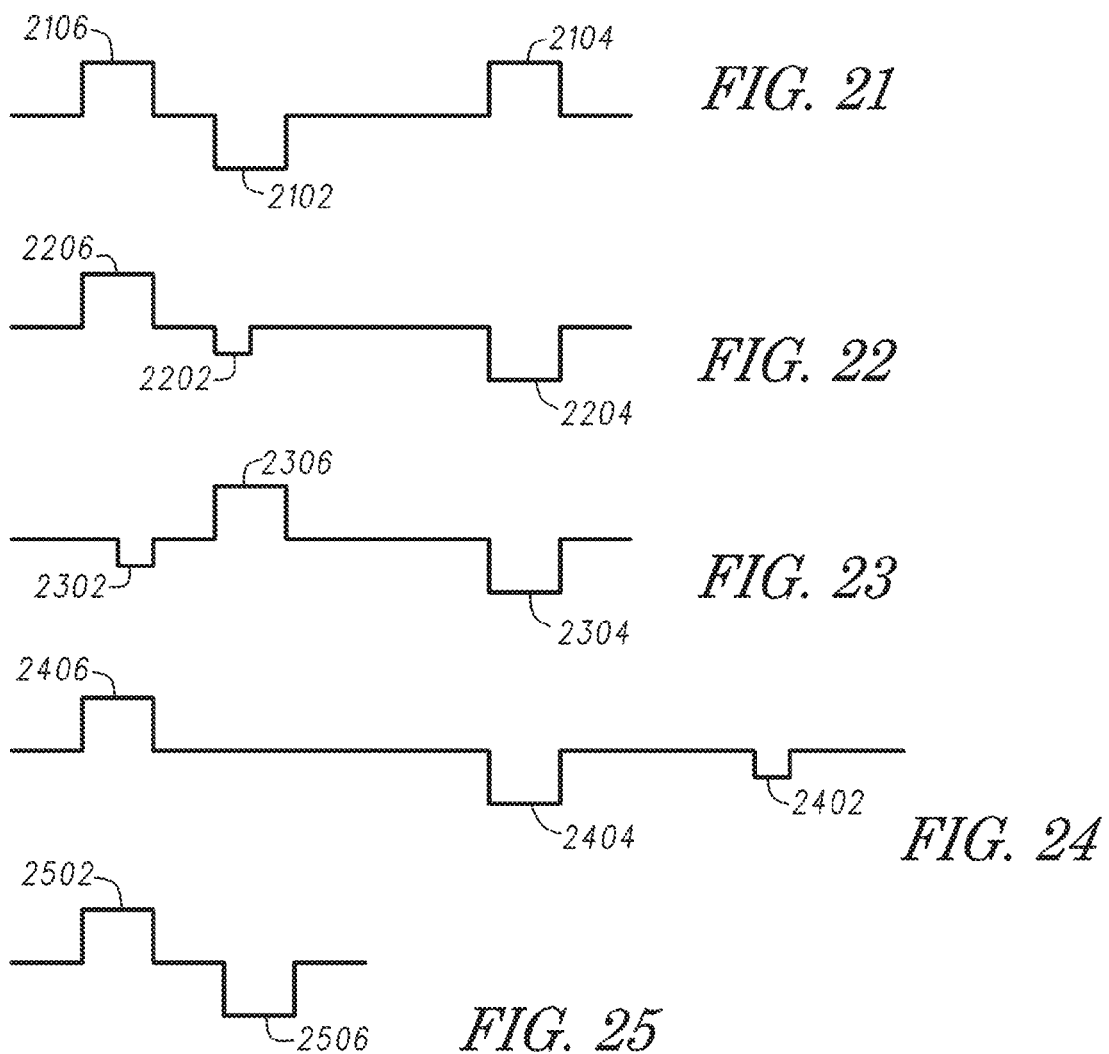

METHOD OF WRITING TO A SPIN TORQUE MAGNETIC RANDOM ACCESS MEMORY

CROSS REFERENCE TO RELATED APPLICATIONS

This application is a divisional of U.S. application Ser. No. 14/313,824 filed Jun. 24, 2014. The content of application Ser. No. 14/313,824 is incorporated by reference herein in its entirety. This application and application Ser. No. 14/313,824 claim priority to and the benefit of U.S. Provisional Application No. 61/846,970 filed Jul. 16, 2013.

TECHNICAL FIELD

The exemplary embodiments described herein generally relate to integrated magnetic devices and more particularly relate to programming methods for magnetoresistive memories.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (for example, a logic "0" state) and high (logic "1" state) electrical resistance states, respectively. Accordingly, a detection of the resistance allows a magnetoresistive memory element, such as an MTJ device, to provide information stored in the magnetic memory element.

There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-transfer torque RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes.

Data stored in memory is defined in banks. A rank is a plurality of banks in a first direction (column) and a channel is a plurality of banks in a second direction (row). A process for accessing the memory comprises several clock cycles required for row and column identification and a read or write operation. The bandwidth for the data transfer may comprise a row of many thousands of bits.

The conventional scheme for programming spin-torque MRAM is to apply a single current or voltage pulse to the memory cells to reverse the direction of their storage layer. The duration of the pulse is set by design requirements such as memory interface specifications. Additional known schemes, to improve the write error rate for example, include using multiple write pulses. The write voltage amplitude also has to be low enough to assure long-term device integrity. Even so, over time, the repeated write voltage pulses wear on the durability of the tunnel junctions and eventually lead to dielectric breakdown.

Accordingly, it is desirable to provide a system and method for programming (writing) an array of memory cells that improves the lifespan of the cells by reducing the chance of dielectric breakdown of the tunnel barrier within the cells. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for writing to a spin-torque magnetoresistive random access memory.

A first exemplary embodiment is a method of providing a write pulse sequence for writing to a plurality of bits in a spin-torque magnetoresistive memory array, the method comprising providing a charging pulse to the bits, the charging pulse having an opposite polarity from one of the write pulse sequence or a read pulse.

A second exemplary embodiment is a memory device comprising an array of ST-MRAM memory cells configured to store data according to a write pulse; and circuitry coupled to the array and configured to provide the write pulse to the memory array; and provide to the memory array a charging pulse having an opposite polarity from one of the write pulse or a read pulse.

A third exemplary embodiment is a method of writing to a plurality of bits in a magnetoresistive memory array, the method comprising providing a write pulse sequence to the bits, the write pulse sequence comprising one or more write pulses; and providing a charging pulse to the bits, the charging pulse having an opposite polarity from the one or more write pulses, the charging pulse occurring one of before or after the write pulse sequence.

BRIEF DESCRIPTION OF THE DRAWINGS

The present invention will hereinafter be described in conjunction with the following drawing figures, wherein like numerals denote like elements.

FIGS. 2-17 are graphic representations of write pulses and charge pulses in accordance with exemplary embodiments;

FIG. 18 is a flow chart of the steps for programming memory cells in accordance with a first exemplary method; and FIG. 19 is a flow chart of the steps for programming memory cells in accordance with a second exemplary method;

FIG. 20 is a flow chart of the steps for programming memory cells in accordance with a self-referenced read method; and FIGS. 21-25 are graphic representations of read pulses, write pulses, and charge pulses in accordance with exemplary embodiments.

DETAILED DESCRIPTION

Figure 1:
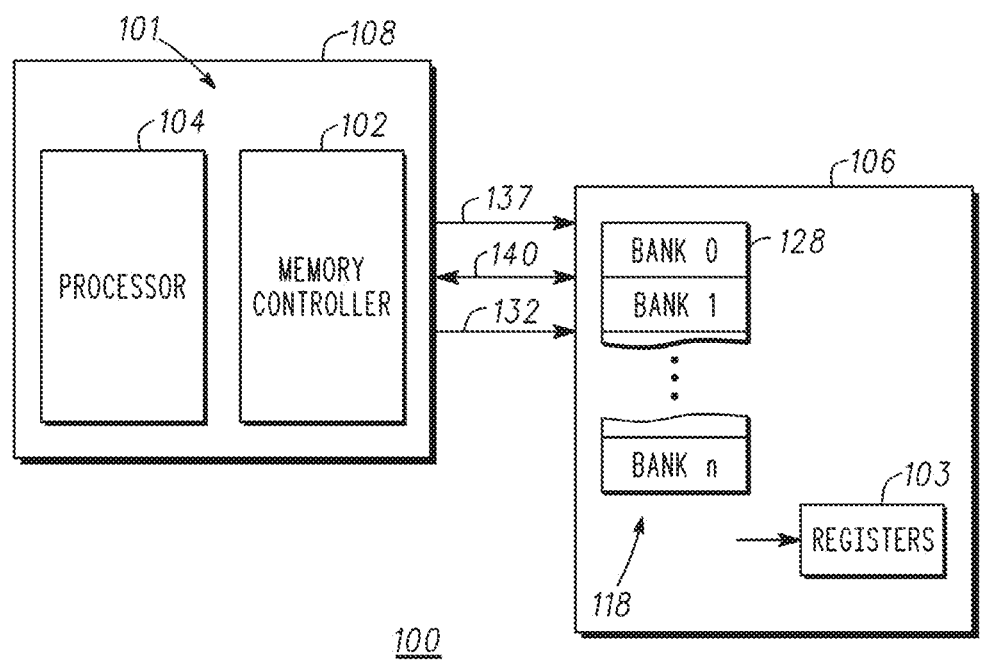
FIG. 1 is a block diagram of circuitry for providing write pulses in accordance with the exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

Although the described exemplary embodiments disclosed herein are directed to various structures and methods for making same, the present invention is not necessarily limited to the exemplary embodiments which illustrate inventive aspects of the present invention that are applicable to a wide variety of semiconductor processes and/or devices. Thus, the particular embodiments disclosed below are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

For the sake of brevity, conventional techniques related to reading and programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Magnetoresistance (MR) is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

FIG. 1 is a block diagram of an exemplary memory system 100 including circuitry 101 comprising a memory controller 102 that performs data transfer between a processor 104 and the memory 106, and is coupled to a register 103 for some embodiments. The invention is not to be limited to this particular type of architecture. The memory controller 102 and the processor 104 may reside on the same chip 108, or they may reside on separate chips (not shown). The memory 106 comprises a non-volatile memory 118 using ST-MRAM magnetic tunnel junctions for data storage, and in some embodiments a set of registers 103. The ST-MRAM memory 118 comprises a plurality of memory banks 128.

A chip select (CS) line 132 provides a CS signal from the memory controller 102 to the non-volatile memory 118. An address bus 137 and a data line 140 couples the memory controller 102 to the non-volatile memory 118. Other control and clock signals may exist between the memory controller 102 and non-volatile memory 118 that are not shown in FIG. 1. Furthermore, an address bus 137 and a data line 140 may include multiple lines or bits.

A charging pulse may be used to extend the lifetime of the ST-MRAM. The number of cycles until MTJ failure due to tunnel barrier oxide breakdown is enhanced when the pulses are alternating in polarity. The ideal case is nearly symmetrical alternating pulses of equal amplitude and duration with alternating polarity. However, even significantly reduced amplitude and or duration pulses extend the MTJ lifetime. Similarly, occasionally alternating the polarity of the pulse can also enhance the lifetime of the MTJ.

In accordance with the exemplary embodiments, a charging pulse of a first polarity is provided either prior to or subsequently to a sequence of one or more write pulses for writing to a plurality of bits in a spin-torque magnetoresistive memory array, the write pulses having a second polarity opposed to the first polarity, thereby increasing the endurance of tunnel barriers within the bits. A write pulse sequence as used herein means one or more voltage/current pulses having amplitude and width applied to a bit for switching the bit to a desired state to store data, while the charging pulse does not determine the desired state. The width and amplitude of the charging pulse may be less than that of the write pulse to minimize any impact on timing and power consumption, respectively. Timing delays could be minimized by providing the charging pulse subsequent to the write pulse sequence.

FIGS. 2-17 are some examples of the relationship between a charging pulse and one or more write pulses in a direct write operation. The charging pulses should be either of high enough amplitude and width to switch all of the bits, or of low enough width and amplitude to not disturb any of the bits. The examples in FIGS. 2-17 illustrate the case for a device with approximately equal voltage required to switch the bit state from 1 to 0 as to switch the bit from 0 to 1. For devices with asymmetric switching voltage the pulses would be adjusted accordingly.

In the following examples, the polarities used could all be inverted with the same effect. FIGS. 2-7 are examples of charging pulses with sufficient amplitude to switch the bits. FIG. 2 is an example of a charging pulse 202 applied prior to, and having a width and amplitude equal to, a write pulse 204. Since all bits being written are switched by both pulses, there is no substantial difference between applying the charge pulse prior to or subsequent to the write pulse in FIGS. 2-10. FIG. 3 is an example of a charging pulse 302 applied prior to, and having an amplitude equal to, but a width greater than, a write pulse 304. FIG. 4 is an example of a charging pulse 402 applied prior to, and having a width equal to and an amplitude greater than, a write pulse 404. FIG. 5 is an example of a charging pulse 502 applied prior to, and having an amplitude and a width greater than, a write pulse 504. FIG. 6 is an example of a charging pulse 602 applied prior to, and having an amplitude greater than, but a width less than, a write pulse 604. FIG. 7 is an example of a charging pulse 702 applied prior to, and having a width greater than, but an amplitude less than, a write pulse 704.

FIGS. 8-17 are examples of charging pulses with low enough width and amplitude to not disturb any of the bits. FIG. 8 is an example of a charging pulse 802 applied prior to, and having a width less than and amplitude equal to, a write pulse 804. FIG. 9 is an example of a charging pulse 902 applied prior to, and having a width equal to and amplitude less than, a write pulse 904. FIG. 10 is an example of a charging pulse 1002 applied prior to, and having a width and amplitude less than, a write pulse 1004. FIG. 11 is an example of a charging pulse 1102 applied subsequent to, and having a width less than and amplitude equal to, a write pulse 1104. FIG. 12 is an example of a charging pulse 1202 applied subsequent to, and having a width equal to and amplitude less than, a write pulse 1204. FIG. 13 is an example of a charging pulse 1302 applied subsequent to, and having a width and amplitude less than, a write pulse 1304. FIG. 14 is an example of a charging pulse 1402 applied prior to, and having an amplitude greater than, but a width less than, a write pulse 1404. FIG. 15 is an example of a charging pulse 1502 applied subsequent to, and having an amplitude greater than, but a width less than, a write pulse 1504. FIG. 16 is an example of a charging pulse 1602 applied prior to, and having an amplitude less than, but a width greater than, a write pulse 1604. FIG. 17 is an example of a charging pulse 1702 applied subsequent to, and having an amplitude less than, but a width greater than, a write pulse 1704.

FIGS. 18, 19, and 20 are flow charts that illustrate an exemplary embodiment of methods 1800, 1900, and 2000, respectively. The various tasks performed in connection with methods 1800, 1900, and 2000 may be performed by software, hardware, firmware, or any combination thereof. For illustrative purposes, the following description of methods 1800, 1900, and 2000 may refer to elements mentioned above in connection with other FIG. 1n practice, portions of methods 1800, 1900, and 2000 may be performed by different elements of the described system. It should be appreciated that methods 1800, 1900, and 2000 may include any number of additional or alternative tasks, the tasks shown in FIGS. 18, 19, and 20 need not be performed in the illustrated order, and methods 1800, 1900, and 2000 may be incorporated into a more comprehensive procedure or process having additional functionality not described in detail herein. Moreover, one or more of the tasks shown in FIGS. 18, 19, and 20 could be omitted from an embodiment of the methods 1800, 1900, and 2000 as long as the intended overall functionality remains intact.

The flow chart of FIG. 18 describes a method of providing a write pulse for writing to a plurality of bits in a spin-torque magnetoresistive memory array, the method comprising providing 1802 a charging pulse to the bits, the charging pulse having an opposite polarity from the write pulse.

The flow chart of FIG. 19 describes a method of writing to a plurality of bits in a magnetoresistive memory array, the method comprising providing 1902 a write pulse to the bits, the write pulse comprising one or more write pulses; providing 1904 a charging pulse to the bits, the charging pulse having an opposite polarity from the write pulse sequence, the charging pulse occurring one of before or after the write pulse sequence.

In an MRAM implementation using a reset operation, such as designs with spin-torque reset for self-referenced read, wherein all the bits in a page or word in the memory array 106 are reset to a predetermined state, for example, "low," with a reset pulse at the beginning of the cycle, and a self-referenced read of each memory cell is performed.

FIG. 20 is a flow chart that illustrates an exemplary embodiment of a destructive read operation with an immediate write-back process 2000 for restoring read bits of an ST-MRAM memory back to their state prior to the destructive read, and includes first sampling 2002 a magnetic bit of the non-volatile memory 118 to provide and store a sampled voltage. An exemplary sample operation is applying a desired bit voltage across a bit; converting the resulting current through the bit into a sample voltage, and storing the sample voltage into a capacitor. A reset write current pulse is applied 2004 to set the bit to 0 (equivalent to a logic state "0"). The bit state is evaluated 2006 by resampling a voltage after step 2004 is complete and comparing the resampled voltage with the sampled voltage from step 2002. An exemplary resample and evaluate operation is applying the same desired bit voltage from step 2002 across the bit; comparing the resulting current through the bit added with an offset current with the current due to the sample voltage from step 2002 to generate an evaluation voltage, and comparing the evaluation voltage with the sample voltage from step 2002 to evaluate the bit state. The bit state is thus determined to be either 0 or 1 depending on the sampled voltage levels from 2002 and 2006. For example, if sampled voltage from 2306 is higher than that from step 2002, the bit state is 0. The sampled voltage levels can be compared in multiple ways to resolve the bit state. If 2008 the bit state is 1, a set write current pulse is applied 2010 to set the bit to 1, thus performing an immediate write-back to restore the bit state. If 2008 the bit state is not 1, no write pulse is needed 2012.

For a self-referenced read operation, a charge pulse may be applied several different ways. The examples in FIGS. 21-24 illustrate the case for a device with approximately equal voltage required to switch the bit state from 1 to 0 as to switch the bit from 0 to 1. For devices with asymmetric switching voltage the pulses would be adjusted accordingly. In these examples, the polarities used could all be inverted with the same effect. FIG. 21 is an example of a charge pulse 2102 applied subsequent to the reset pulse 2106. The charge pulse 2102 is sufficient to switch all of the bits, and could have an amplitude less than, equal to, or greater than the reset pulse 2106, and could have a width that is less than, equal to, or greater than the reset pulse 2106 and the charge pulse 2102 is applied prior to the write-back pulse 2104. FIG. 22 is an example of a charge pulse 2202 applied subsequent to the reset pulse 2206. The charge pulse 2202 is sufficiently reduced to not disturb the bit state, and could have an amplitude less than, equal to, or greater than the reset pulse 2206, and could have a width that is less than, equal to, or greater than the reset pulse 2206. The write-back pulse 2204 is applied subsequent to the charge pulse 2202. FIG. 23 is an example of a charge pulse 2302 applied prior to the reset pulse 2306. The charge pulse 2302 is sufficiently reduced to not disturb the bit state, and could have an amplitude less than, equal to, or greater than the reset pulse 2306, and could have a width that is less than, equal to, or greater than the reset pulse 2306. FIG. 24 is an example of a charge pulse 2402 applied during or subsequent to the write-back. The charge pulse 2402 is sufficiently reduced to not disturb the bit state, and could have an amplitude less than, equal to, or greater than the reset pulse 2406, and could have a width that is less than, equal to, or greater than the reset pulse 2406. The charge pulse 2402 could be applied to all bits or only the bits which did not receive the write-back pulse 2404.

In another exemplary embodiment, an opposite polarity charging pulse would be applied periodically, e.g., one charging pulse for every eight write pulses, thereby minimizing the impact on timing while improving performance. Registers 103 can be used to record the occurrence of accesses to an assembly of bits, such as memory page or word, and trigger a charging pulse when the number of accesses reaches a threshold value. The registers 103 may alternatively be dedicated memory bits.

For an MRAM non-destructive read operation (read-before-write), there is a potential for a large number of unipolar read pulses to be applied to the tunnel barrier. If the number of read operations a memory part experiences over its lifetime is significantly greater than the number of write operations, the main source of electrical stress on the tunnel barrier originates from read operations. The reading is accomplished a first polarity and a charging pulse a second opposite polarity is applied prior to or subsequent to the read pulse. See for example FIG. 25 having a charge pulse 2502 occurring prior to the read pulse 2506. The amplitude and duration of the charging pulse are chosen such as not to disturb any of the bits.

In another exemplary embodiment, the endurance of the memory to dielectric breakdown can be improved by alternating the read polarity on each occurrence. Registers 103 can be used to keep track of the read voltage polarity.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of accessing a magnetoresistive bit, comprising:
    applying a first read pulse having a first polarity to the magnetoresistive bit, wherein each read pulse is used in evaluating a bit state for the magnetoresistive bit;
    recording the first polarity in a register; and
    after recording the first polarity in the register:
        applying a second read pulse to the magnetoresistive bit, wherein a second polarity for the second read pulse is determined based on the first polarity recorded in the register, wherein the second polarity is opposite the first polarity; and
        recording the second polarity in the register.

2. The method of claim 1, further comprising:
    after recording the second polarity in the register, applying additional read pulses to the magnetoresistive bit, wherein polarity of each additional read pulse is determined based on the polarity recorded in the register such that polarity of read pulses provided to the magnetoresistive bit alternate, wherein the register is used to keep track of polarity for each read pulse.

3. The method of claim 1, further comprising:
applying a write pulse sequence to the magnetoresistive bit, the write pulse sequence including one or more pulses of the second polarity having an amplitude and duration to switch the bit to a desired bit state; and
applying a charging pulse having the first polarity to the magnetoresistive bit, wherein the charging pulse does not determine the desired bit state.

4. The method of claim 3, wherein the charging pulse is applied to the magnetoresistive bit before the write pulse sequence.

5. The method of claim 4, wherein the charging pulse has sufficient amplitude and duration to switch the magnetoresistive bit.

6. The method of claim 5, wherein the write pulse sequence consists of a single write pulse having an amplitude and a duration, and wherein the charging pulse is nearly symmetrical with respect to the single write pulse such that an amplitude and a duration of the charging pulse is equal to the amplitude and the duration of the single write pulse.

7. The method of claim 3, wherein the charging pulse is applied to the magnetoresistive bit after the write pulse sequence.

8. The method of claim 7, wherein the write pulse sequence consists of a single write pulse having an amplitude and a duration, and wherein the charging pulse has at least one of a lesser amplitude and a lesser duration in comparison to the amplitude and the duration of the single write pulse.

9. The method of claim 7, wherein the first charging pulse does not disturb the bit.

10. The method of claim 3 further comprises applying a plurality of additional write pulse sequences to the bit without corresponding charging pulses.

11. The method of claim 3, further comprising:
applying additional charging pulses having the first polarity to the magnetoresistive bit periodically such that a charging pulse is applied to the magnetoresistive bit for each occurrence of a selected number of write pulse sequences having the second polarity.

12. A method of performing a write operation that stores a desired state in a magnetoresistive bit, the method comprising:
as a part of the write operation and before applying a write pulse sequence to the magnetoresistive bit, applying a charging pulse having a first polarity to the magnetoresistive bit, wherein the charging pulse has sufficient amplitude and duration to switch the magnetoresistive bit; and
as a part of the write operation and after providing the charging pulse, applying the write pulse sequence to the magnetoresistive bit to switch the magnetoresistive bit to the desired state, the write pulse sequence including one or more write pulses having a second polarity that is opposite the first polarity.

13. The method of claim 12, wherein the write pulse sequence consists of a single write pulse having an amplitude and a duration, and wherein the charging pulse is nearly symmetrical with respect to the single write pulse such that an amplitude and a duration of the charging pulse is equal to the amplitude and the duration of the single write pulse.

14. The method of claim 12, wherein the write pulse sequence consists of a single write pulse having an amplitude and a duration, and wherein the charging pulse has a different amplitude than the single write pulse.

15. The method of claim 12, wherein the write pulse sequence consists of a single write pulse having an amplitude and a duration, and wherein the charging pulse has a different duration than the single write pulse.

16. The method of claim 12, wherein the write pulse sequence includes a plurality of write pulses.

17. A method of performing a series of write operations to a magnetoresistive bit, wherein each write operation stores a corresponding desired state in a magnetoresistive bit, comprising:
as a part of a first write operation, applying a first charging pulse having a first polarity to the magnetoresistive bit, wherein the first charging pulse does not determine the desired state corresponding to the first write operation for the magnetoresistive bit;
as a part of the first write operation, applying a first write pulse sequence to the magnetoresistive bit to switch the magnetoresistive bit to the desired state corresponding to the first write operation, the write pulse sequence including one or more write pulses having a second polarity that is opposite the first polarity; and
applying a plurality of additional write pulse sequences to the magnetoresistive bit for additional write operations in the series of write operations, wherein the additional write pulse sequences are applied without corresponding charging pulses.

18. The method of claim 17, wherein the first charging pulse is applied before the first write pulse.

19. The method of claim 18, wherein the first charging pulse has sufficient amplitude and duration to switch the magnetoresistive bit.

20. The method of claim 17, further comprising, after applying the plurality of additional write pulse sequences, periodically applying additional charging pulses such that one charging pulse is periodically applied for each occurrence of a selected number of write pulse sequences having the second polarity.

* * * * *